(12) United States Patent
Lin

(10) Patent No.: US 12,281,816 B2
(45) Date of Patent: Apr. 22, 2025

(54) GAS CURTAIN DEVICE FOR LOAD PORT

(71) Applicant: SPRINGFIELD TECHNOLOGIES & INTELLIGENCE, INC., Taipei (TW)

(72) Inventor: Kuan-Ting Lin, Taipei (TW)

(73) Assignee: SPRINGFIELD TECHNOLOGIES & INTELLIGENCE, INC., Taipei (TW)

( * ) Notice: Subject to any disclaimer, the term of this patent is extended or adjusted under 35 U.S.C. 154(b) by 448 days.

(21) Appl. No.: 17/659,445

(22) Filed: Apr. 15, 2022

(65) Prior Publication Data
US 2023/0167992 A1    Jun. 1, 2023

(30) Foreign Application Priority Data
Nov. 29, 2021   (TW) .................. 110144458

(51) Int. Cl.
*F24F 9/00*  (2006.01)
*H01L 21/67*  (2006.01)
*H01L 21/677*  (2006.01)

(52) U.S. Cl.
CPC .......... *F24F 9/00* (2013.01); *H01L 21/67017* (2013.01); *H01L 21/67742* (2013.01)

(58) Field of Classification Search
CPC . F24F 9/00; H01L 21/67017; H01L 21/67742
See application file for complete search history.

(56) References Cited

U.S. PATENT DOCUMENTS
2021/0239354 A1*  8/2021  Wilson ................. F24F 13/26

FOREIGN PATENT DOCUMENTS
DE  202006006228 U1 *  8/2006  ............... F24F 9/00
TW  M576338 U  *  4/2019

OTHER PUBLICATIONS

Search Report appended to an Office Action, which was issued to Taiwanese counterpart application No. 110144458 by the TIPO on Jul. 7, 2022, with an English translation thereof.

* cited by examiner

*Primary Examiner* — Jorge A Pereiro
*Assistant Examiner* — Michael James Giordano
(74) *Attorney, Agent, or Firm* — Lewis Roca Rothgerber Christie LLP

(57) ABSTRACT

A gas curtain device for a load port includes a casing, a holding unit, a gas-permeable plate, and a fastener unit. The casing defines an inner space and including a flange that defines a gas outlet in spatial communication with the inner space. The holding unit is disposed in the casing, and defines a ventilation opening. The plate is positioned between the holding unit and the inner flange, and has holes. A curtain-forming gas is introduced into the inner space, and sequentially flows through the ventilation opening and the holes to be discharged from the gas outlet to form a gas curtain. The fastener unit connects removably the holding unit and the plate to the flange.

12 Claims, 11 Drawing Sheets

GAS CURTAIN DEVICE FOR LOAD PORT

CROSS-REFERENCE TO RELATED APPLICATION

This application claims priority of Taiwanese Patent Application No. 110144458, filed on Nov. 29, 2021.

FIELD

The disclosure relates to a gas curtain device, more particularly to gas curtain device for a load port, which is employed in a semiconductor manufacturing process.

BACKGROUND

A load port is located at one side of a semiconductor manufacturing device, and is configured to support a front opening unified pod (FOUP) thereon so as to permit the semiconductor manufacturing device to access wafers inside the FOUP. A gas curtain device is mounted to the load port to form a gas curtain for preventing entrance of moisture or foreign matter into the FOUP. Referring to FIG. 1, a conventional gas curtain device 1 includes a gas curtain box 11 connected to an air purification system (not shown) supplying clean dry air (CDA) as a curtain-forming gas, and a gas-permeable member 12 connected to an inner surface of the gas curtain box 11 by an adhesive. The curtain-forming gas is introduced into the gas curtain box 11 and flows through the air-permeable member 12 to be discharged out of the gas curtain box 11 to form a gas curtain.

However, since the air-permeable member 12 is connected to the gas curtain box 11 by an adhesive, aging of the adhesive may occur after a time period of use, so that the air-permeable member 12 is debonded from the gas curtain box 11. Consequently, a gap is formed between the gas curtain box 11 and the air-permeable member 12, which adversely affects the moisture shielding effect of gas curtain and thus humidity control on the load port for the FOUP. Furthermore, it is necessary to replace the entire gas curtain device when the adhesive is aged or the service life of the air-permeable member 12 is reached.

SUMMARY

Therefore, an object of the disclosure is to provide a gas curtain device that is convenient for maintenance.

According to an aspect of the disclosure, a gas curtain device for a load port is provided. The gas curtain device includes a gas curtain box, a holding unit, a gas-permeable plate, and a plurality of fastener members. The gas curtain box includes a casing that defines an inner space and that includes an inwardly extending inner flange defining a gas outlet. The gas outlet is in spatial communication with the inner space, and is adapted to permit a curtain-forming gas introduced into the inner space to be discharged from the gas outlet. The holding unit is disposed in the inner space, is connected to the casing, and includes a positioning frame that defines a ventilation opening. The gas-permeable plate is positioned between the positioning frame and the inner flange and is formed with a plurality of holes. The curtain-forming gas introduced into the inner space sequentially flows through the ventilation opening of the positioning frame and the holes of the gas-permeable plate to be discharged from the gas outlet to form a gas curtain. The fastener members extend through the holding unit, the gas-permeable plate and into the inner flange of the casing so as to fasten the holding unit and the gas-permeable plate to the inner flange such that the holding unit and the gas-permeable plate are positioned in the inner space.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
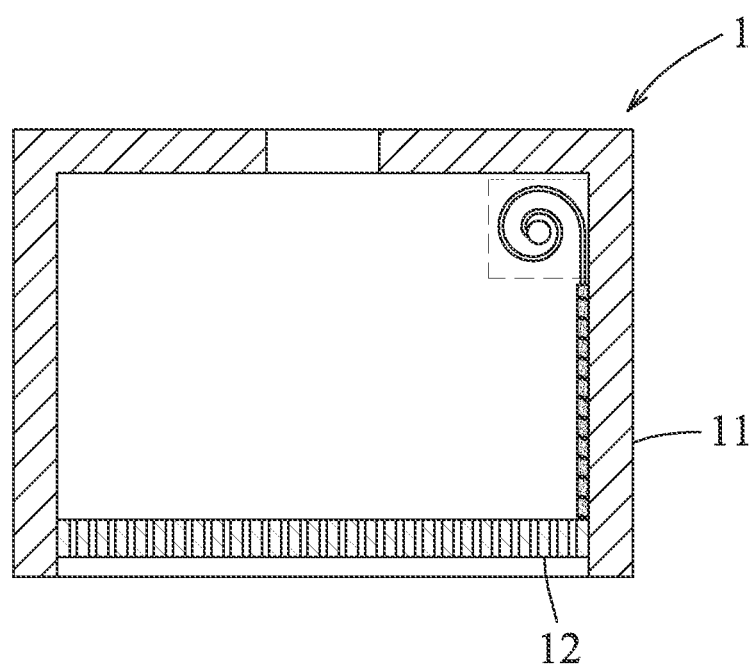
FIG. 1 is a schematic sectional view of a conventional gas curtain device.

Before the present disclosure is described in greater detail, it should be noted herein that like elements are denoted by the same reference numerals throughout the disclosure.

Figure 2:
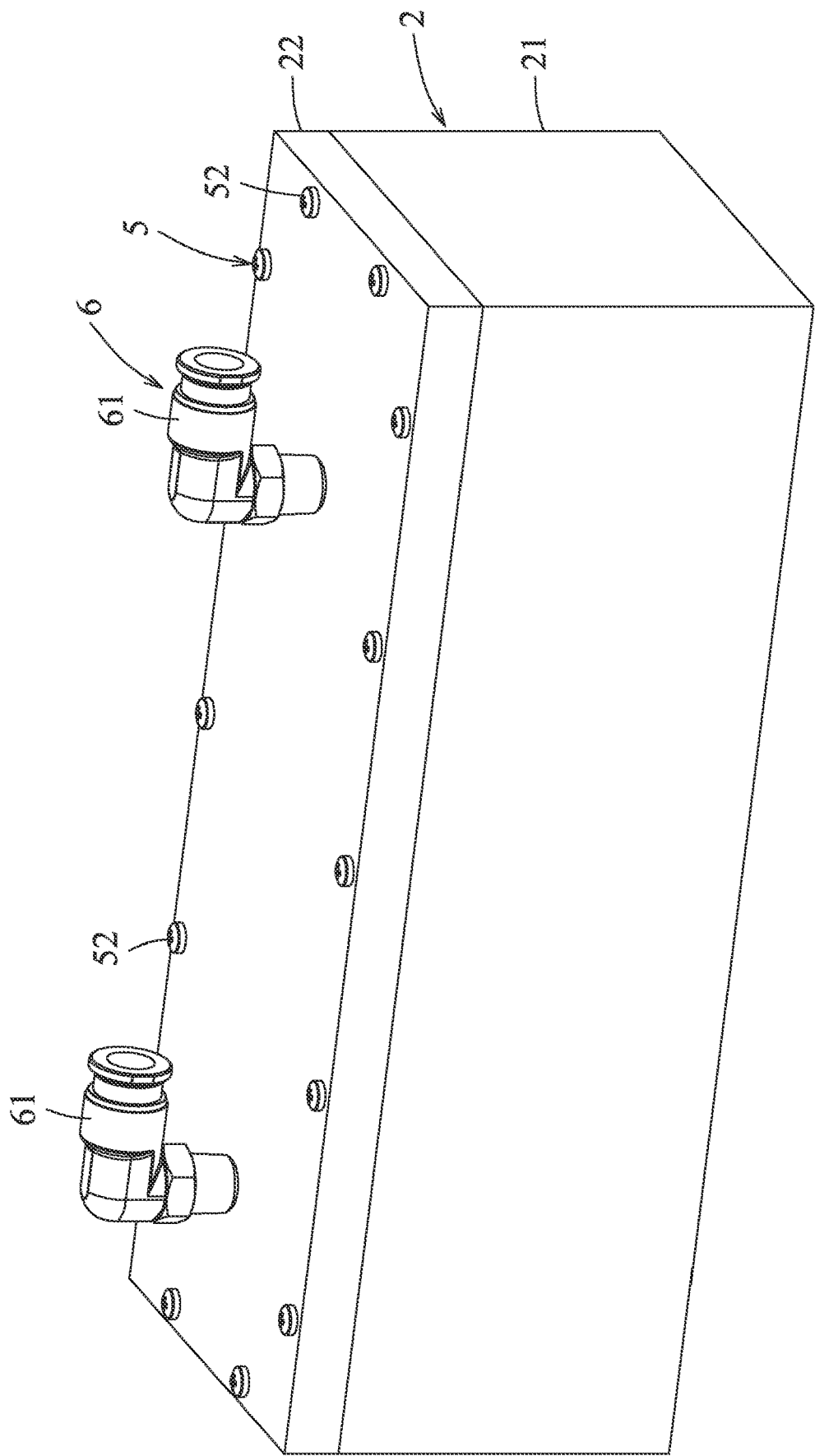
FIG. 2 is a perspective view of a first embodiment of a gas curtain device for a load port according to the present disclosure.
Figure 3:
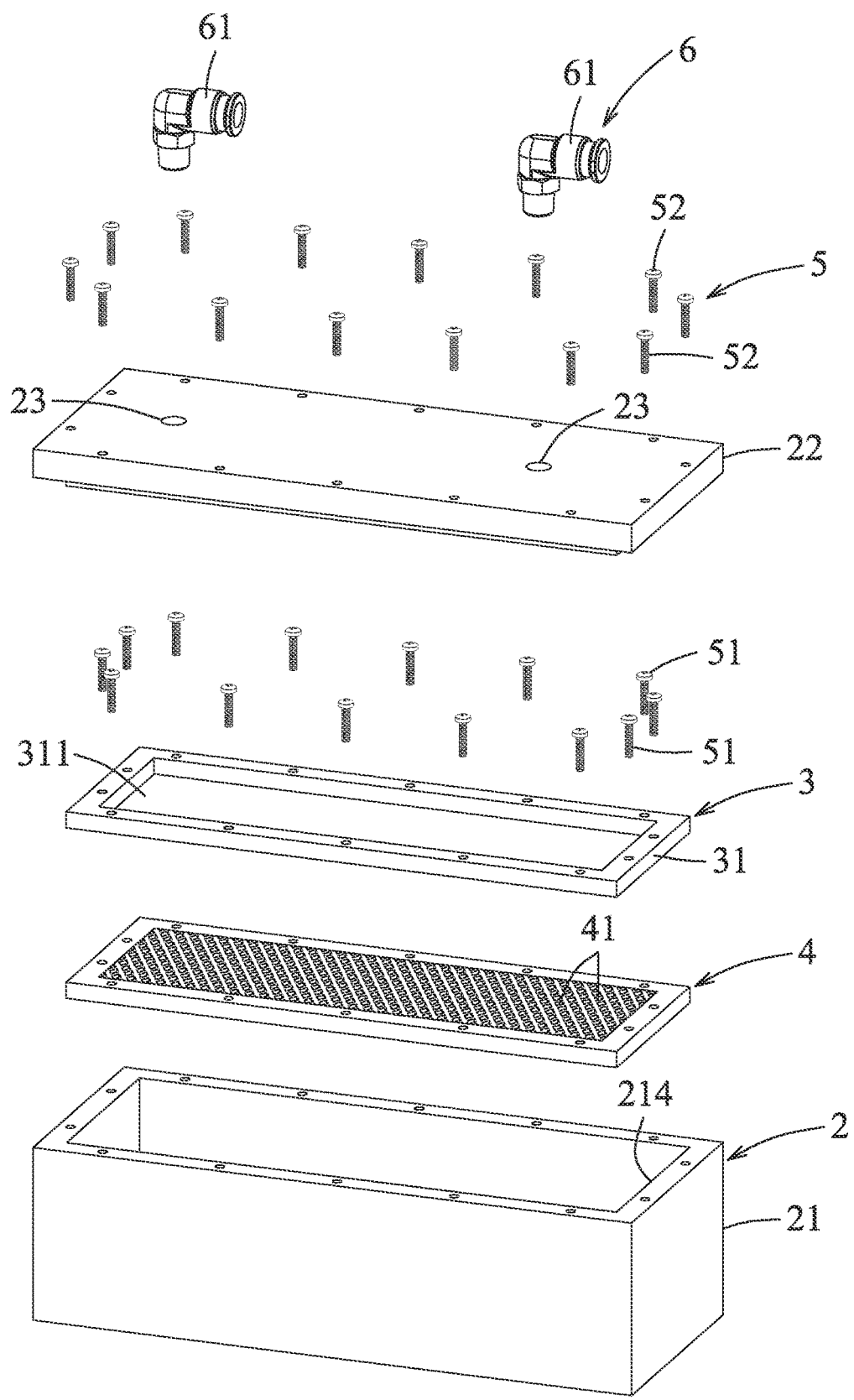
FIG. 3 is an exploded perspective view of the first embodiment.
Figure 4:
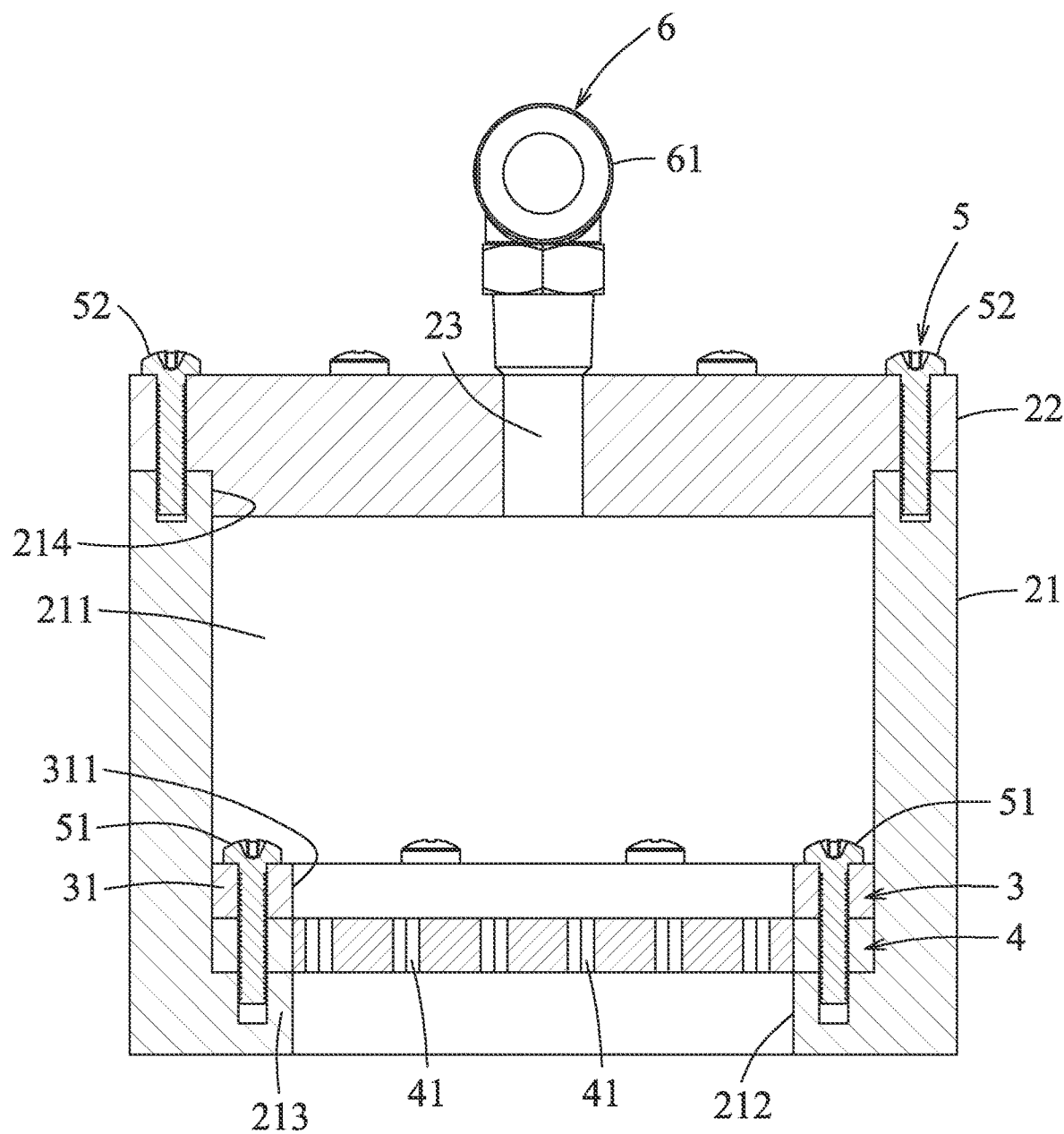
FIG. 4 is a schematic sectional view of the first embodiment.

Referring to FIGS. 2 to 4, a gas curtain device for a load port of a first embodiment according to the present disclosure includes a gas curtain box 2, a holding unit 3, a gas-permeable plate 4, a fastener unit 5, and a pipe unit 6.

The gas curtain box 2 is adapted to permit a curtain-forming gas which may be, but is not limited to, clean dry air (CDA) supplied by an air purifying system (not shown) to be introduced thereinto. The gas curtain box 2 includes a casing 21 defining an inner space 211 and including an inwardly extending inner flange 213 defining a gas outlet 212 which is in spatial communication with the inner space 211, and which is adapted to permit the curtain-forming gas introduced into the inner space 211 to be discharged from the gas outlet 212.

The holding unit 3 is disposed in the inner space 211, is connected to the casing 21, and includes a positioning frame 31 that defines a ventilation opening 311.

The gas-permeable plate 4 is clamped between the positioning frame 31 and the inner flange 213, and has a plurality of holes 41.

The fastener unit 5 includes a plurality of first fastener members 51. Each of the first fastener members 51 extends through the positioning frame 31, the gas-permeable plate 4 and into the inner flange 213 of the casing 21 so as to fasten the positioning frame 31 and the gas-permeable plate 4 to the inner flange 213 such that the holding unit 3 and the gas-permeable plate 4 are positioned in the inner space 211.

The curtain-forming gas introduced into the inner space 211 sequentially flows through the ventilation opening 311 of the positioning frame 31 and the holes 41 of the gas-permeable plate 4 to be discharged from the gas outlet 212 to form a gas curtain.

It should be noted that the positioning frame 31 has a thickness ranging from 2 millimeters (mm) to 5 mm to provide a relatively good fixing effect for the first fastener members 51.

By virtue of the positioning frame 31, the gas-permeable plate 4 is clamped between the positioning frame 31 and the inner flange 213 of the casing 21. Since no adhesive is used to connect the gas-permeable plate 4 and the casing 21, a gap would not be formed between the gas-permeable plate 4 and the casing 21 of the gas curtain box 2 due to aging of the adhesive, and thus the moisture shielding effect of the air curtain would not be affected. In addition, when the service life of the gas-permeable plate 4 is reached, or either one of the positioning frame 31 and the casing 21 is damaged, the first fastener members 51 can be loosened to allow separation of the positioning frame 31, the gas-permeable plate 4, and the casing 21 from one another so as to replace or maintain any one of the positioning frame 31, the gas-permeable plate 4 and the casing 21 without replacing all of the elements of the gas curtain device. In this way, the effect of convenient maintenance can be achieved. It should be noted that by virtue of the first fastener members 51, the gas-permeable plate 4 can be replaced any time by a gas-permeable plate made of different materials or having different thickness so as to optimize the moisture shielding effect of the gas curtain as required. Thus, the field flow requirements of a load port mounted with the gas curtain device of the present disclosure can be met.

Additionally, since the direction in which the first fastener members 51 are engaged into the positioning frame 31 is the same as the direction in which the curtain-forming gas is discharged from the gas outlet 212, the gas curtain would not affect the locking stability of the first fastener members 51. It should be noted that, in this embodiment, the casing 21 further defines a casing opening 214. The casing opening gas outlet 212 are disposed respectively at two opposite ends of the casing 21. The gas curtain box 2 further includes a cover 22 removably covering the casing opening 214. When the cover 22 does not cover on the casing opening 214, the first fastener members 51 can be moved into the casing opening 214 to extend through the positioning frame 31, the gas-permeable plate 4 and into the inner flange 213 of the casing 21 so as to fasten the positioning frame 31 and the gas-permeable plate 4 to the inner flange 213. In this embodiment, the fastener unit 5 further includes a plurality of second fastener members 52 extending through the cover 22 and the casing 21 so as to fasten the cover 22 to the casing 21.

It should be noted that, in this embodiment, the pipe unit 6 is adapted to be connected to an air purifying system supplying the curtain-forming gas, and includes two piping members 61. The casing 21 of the gas curtain box 2 further includes two gas inlets 23 formed in the cover 22, in spatial communication with the inner space 211, and in spatial communication respectively with the piping members 61 of the pipe unit 6 such that the curtain-forming gas is introduced from the piping members 61 into the gas inlets 23 and the inner space 211 of the casing 21.

Figure 5:
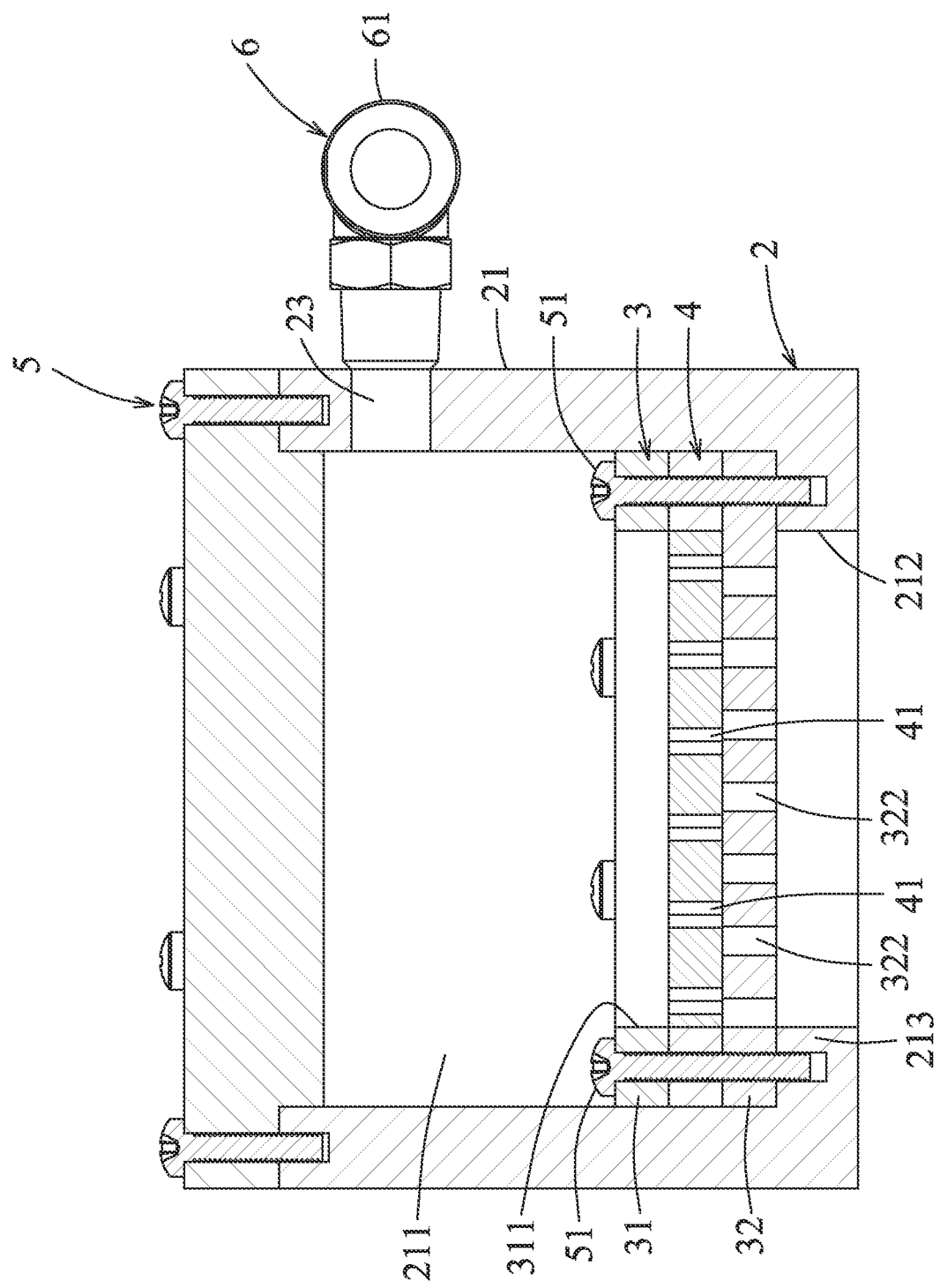
FIG. 5 is a schematic sectional view of a second embodiment of the gas curtain device for a load port according to the present disclosure.
Figure 6:
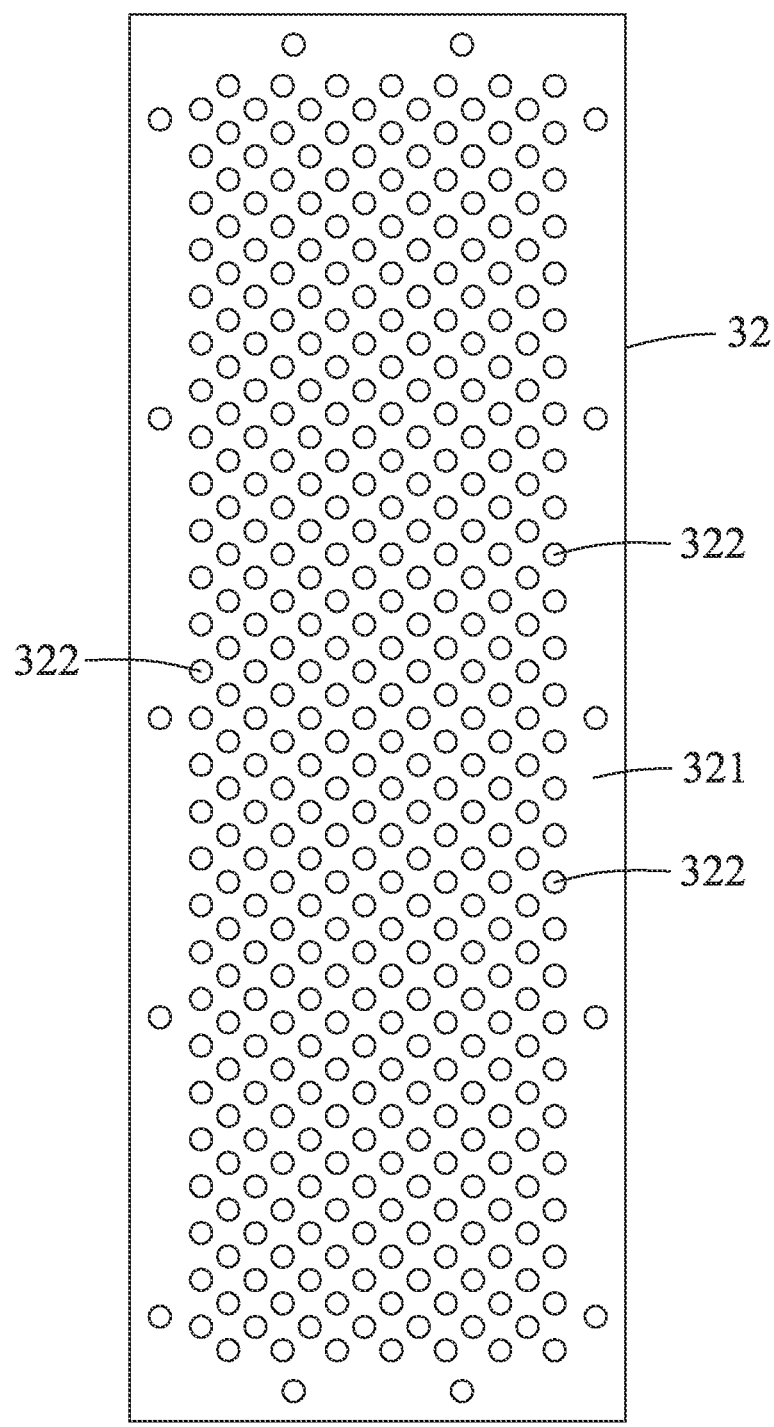
FIG. 6 is a top view of a supporting member of the gas curtain device of the second embodiment.

Referring to FIGS. 5 and 6, a second embodiment of the gas curtain device according to the present disclosure is similar to the first embodiment, and includes the gas curtain box 2, the holding unit 3, the gas-permeable plate 4, the fastener unit 5, and the pipe unit 6. The differences between the second embodiment and the first embodiment reside in that the holding unit 3 of the second embodiment further includes a supporting member 32 disposed between and abutting against the gas-permeable plate 4 and the inner flange 213, and the gas inlets 23 are formed in the casing 21.

The supporting member 32 is clamped between and abuts against the gas-permeable plate 4 and the inner flange 213. The first fastener members 51 detachably extend through the positioning frame 31, the gas-permeable plate 4, the supporting member 32, and into the inner flange 213 of the casing 21 so as to fasten the positioning frame 31, the gas-permeable plate 4 and the supporting member 32 to the inner flange 213. The supporting member 32 may include a porous plate made of, e.g., but not limited to aluminum. Specifically, the supporting member 32 has a supporting plate 321 formed with a plurality of ventilation holes 322 each of which is in spatial communication with the gas outlet 212 and a corresponding one of the holes 41 of the gas-permeable plate 4. Each of the ventilation holes 322 has a diameter ranging from 0.01 centimeters (cm) to 2 cm.

Figure 7:
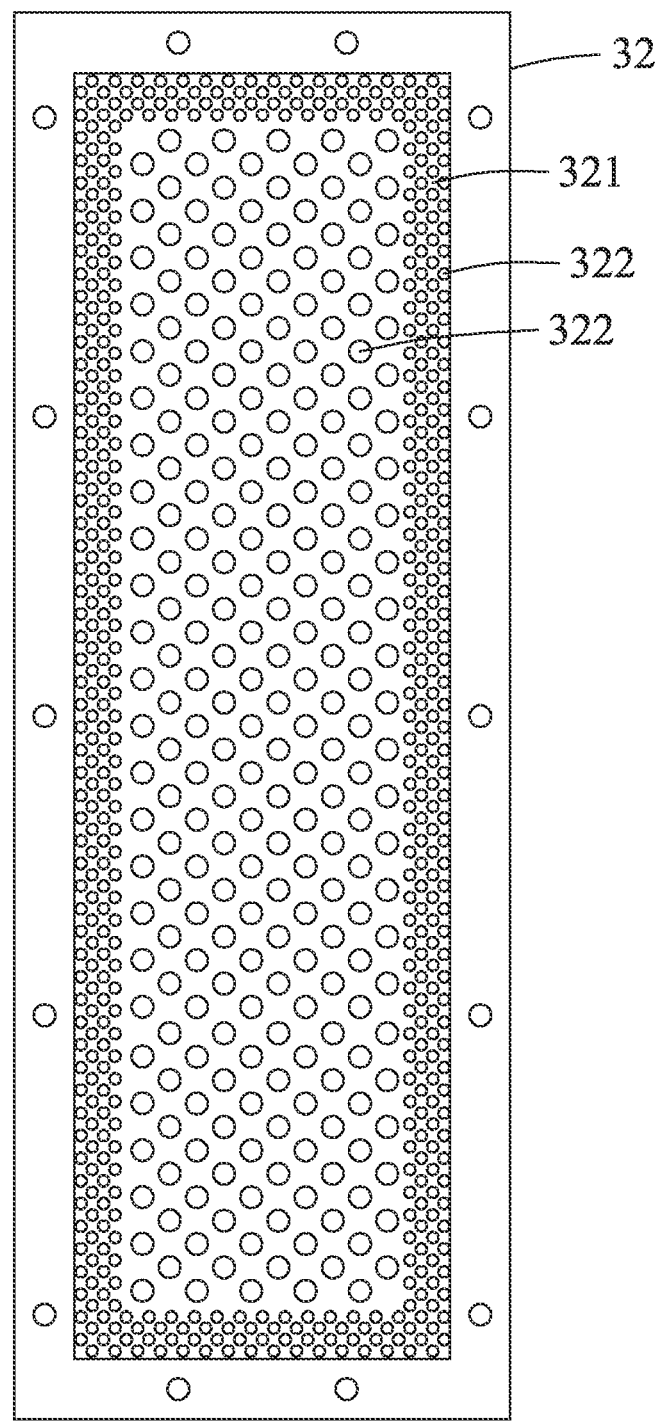
FIGS. 7 to 11 are schematic top views illustrating different variations of the supporting member of the second embodiment.
Figure 8:
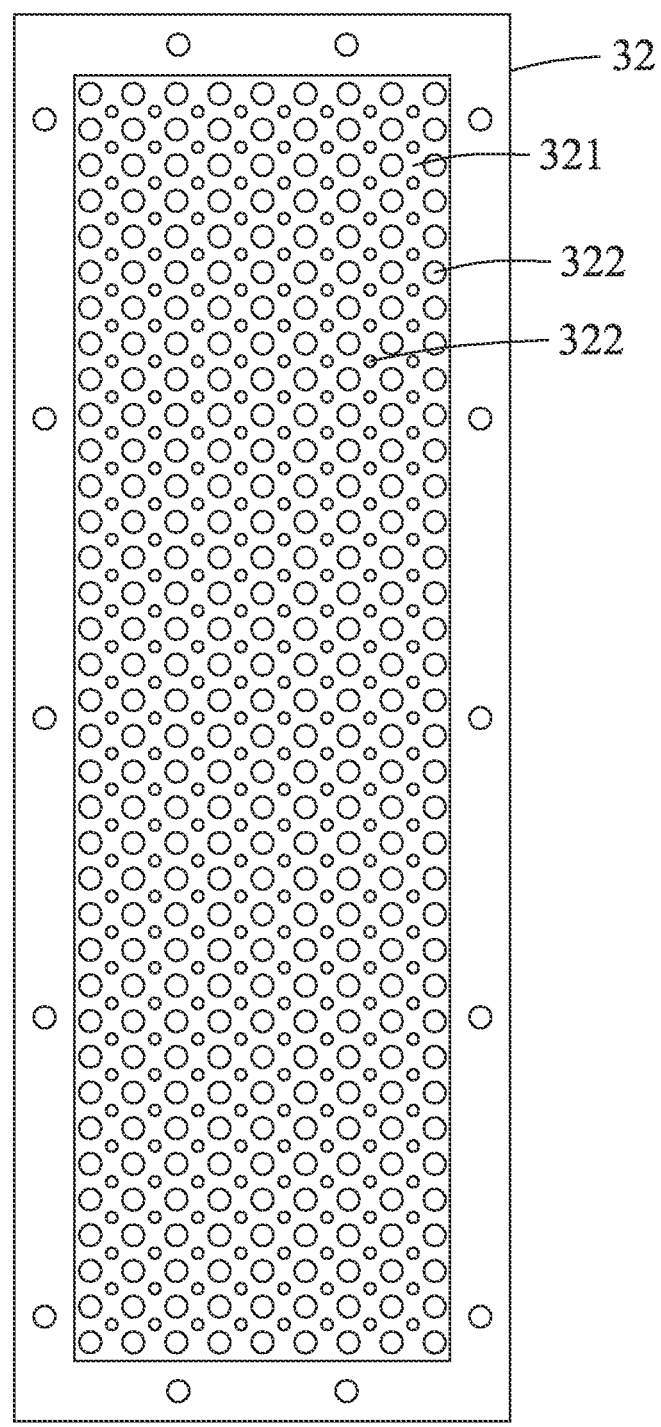

Referring to FIGS. 7 and 8, some variations of the supporting member 32 of the second embodiments are shown. The diameters of the ventilation holes 322 may be the same (see FIG. 6) or different from one another (see FIGS. 7 and 8). Additionally, the arrangement of the ventilation holes 322 having different diameters may be different. As shown in FIG. 7, the diameter of each of the ventilation holes 322 disposed at a periphery of the supporting plate 321 is smaller than that of each of the ventilation holes 322 disposed in the middle portion of the supporting plate 321. In another variation shown in FIG. 8, the ventilation holes 322 having different diameters are arranged evenly in the supporting plate 321 and the arrangement of the ventilation holes 322 is not limited to these examples.

Figure 9:
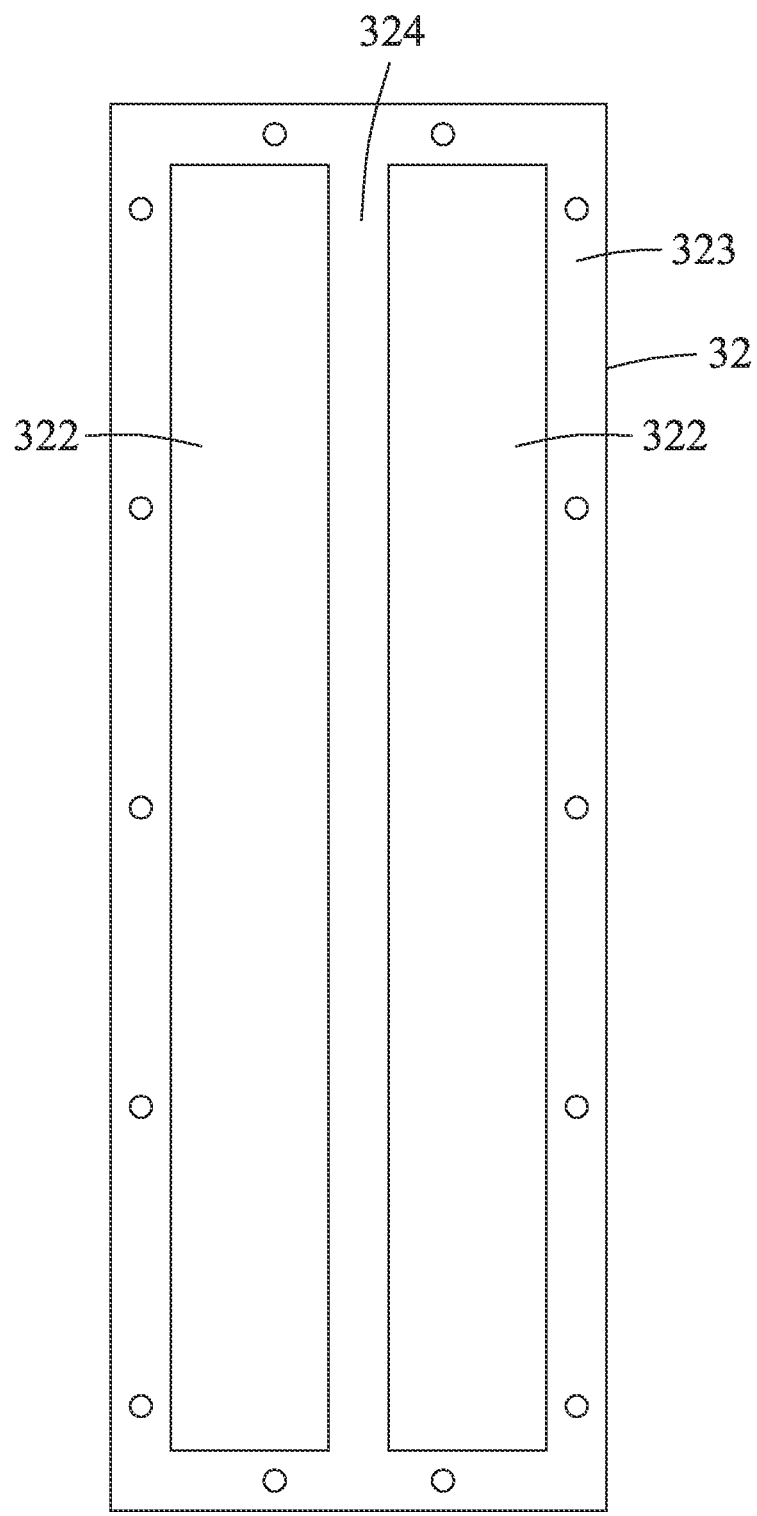
Figure 10:
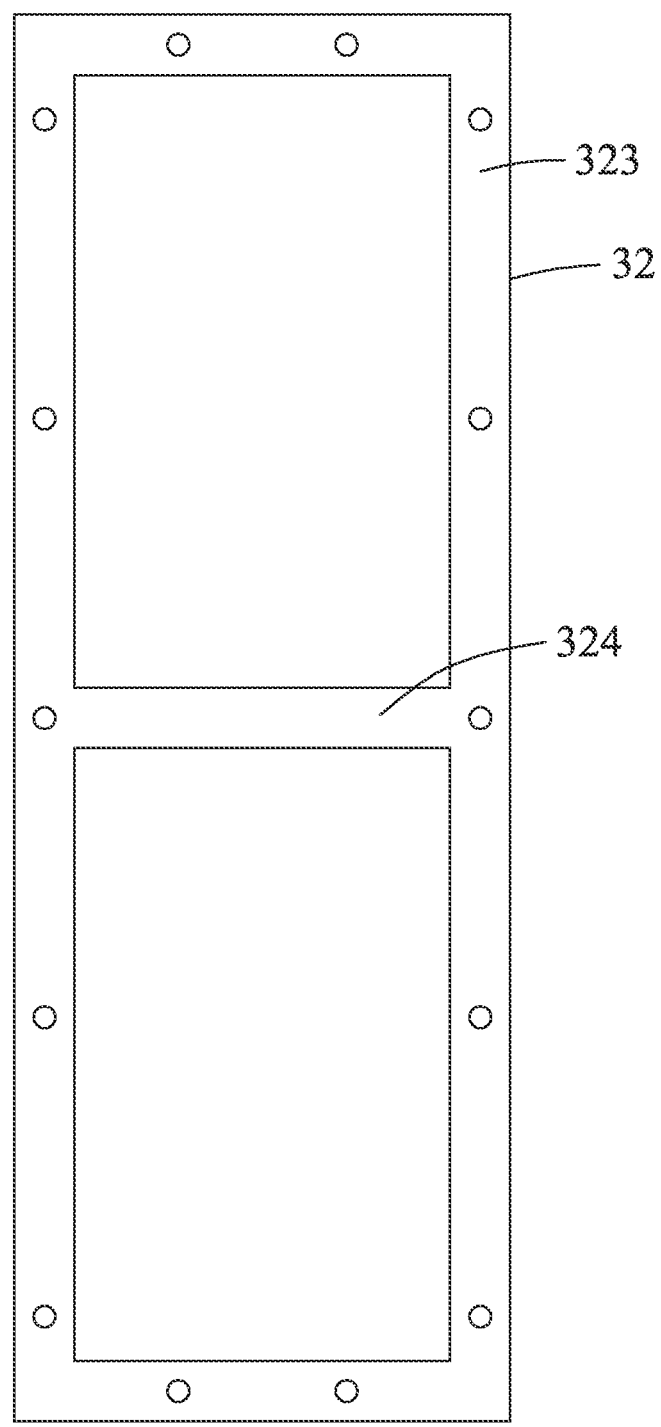
Figure 11:
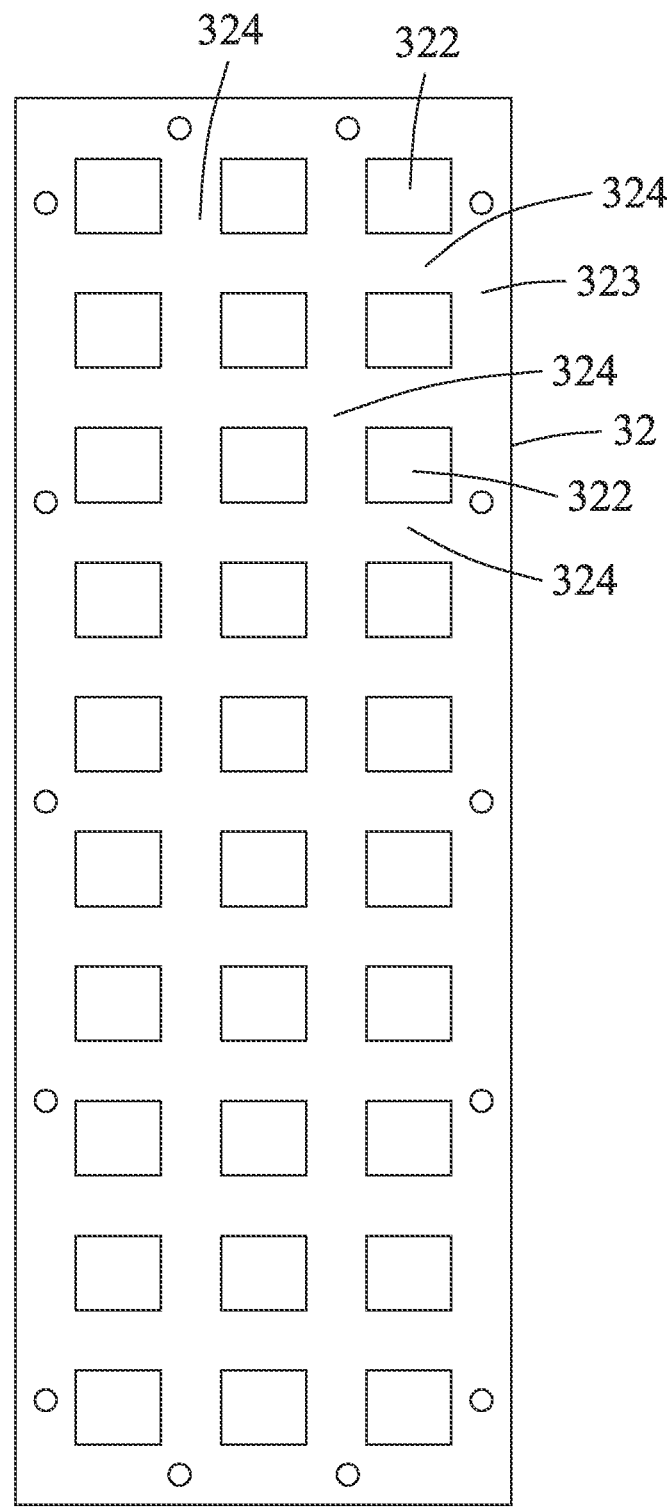

Referring to FIGS. 9 to 11, some variations of the supporting member 32 of the second embodiments are shown. As shown in FIG. 9, in this variation, the supporting member 32 includes a rectangular frame 323 having two parallel long frame sections and two parallel short frame sections interconnecting the long frame sections, and a supporting wall 324 having two ends connected respectively to intermediate portions of the short frame sections of the rectangular frame 323. The surrounding wall 323 and the at least one supporting wall 324 define the at least two ventilation holes 322. The variation of the supporting member 32 shown in FIG. 10 is similar to that shown in FIG. 9 except that two ends of the supporting wall 324 are connected respectively to intermediate portions of the long frame sections of the rectangular frame 323. As shown in FIG. 11, another variation of the supporting member 32 includes a plurality of the supporting walls 324 cooperating with the surrounding wall 323 to define a plurality of the ventilation holes 322.

The second embodiment possesses the advantage of the first embodiment. In the second embodiment, the arrangement of the supporting member 32 facilitates the gas-permeable plate 4 to be fixed firmly between the positioning frame 31 and the inner flange 213 of the casing 21 due to the fact that contact area between the gas-permeable plate 4 and the supporting member 32 is greater than that between the gas-permeable plate 4 and the inner flange 213. Thus, the service life of the gas-permeable plate 4 is increased. In this embodiment, the supporting member 32 has a thickness ranging from 2 mm to 5 mm to provide a relatively good fixing effect.

In the second embodiment, the gas inlets 23 are also in spatial communication respectively with the piping members 61 of the pipe unit 6 such that the curtain-forming gas is introduced from the piping members 61 into the gas inlets 23 and the inner space 211 of the casing 21. Note that the positions and the number of the piping members 61 and the gas inlets 23 are not limited to the examples described in the first and second embodiments and may be modified as long as the curtain-forming gas is permitted to enter the inner space 211 and discharged from the gas outlet 212 to form a gas curtain.

To sum up, in the gas curtain device of the present disclosure, by virtue of the holding unit 3 and the fastener unit 5, the gas-permeable plate 4 is positioned between the positioning frame 31 and the inner flange 213 of the casing 21, and the adhesive, which is used in the conventional gas curtain device shown in FIG. 1, for connecting the gas-permeable plate 4 to the casing 21 can be omitted. Thus, a gap between the gas-permeable plate 4 and the casing 21 that adversely affect the effect of the gas curtain would not occur. In addition, the user can easily replace the gas-permeable plate 4 by removing the first fastener members 51 when the service life of the gas-permeable plate 4 is reached, without replacing all of the elements of the gas curtain device. Thus, the object of this disclosure is indeed achieved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A gas curtain device for a load port comprising:
   a gas curtain box including a casing that defines an inner space and that includes an inwardly extending inner flange defining a gas outlet which is in spatial communication with said inner space, and which is adapted to permit a curtain-forming gas introduced into said inner space to be discharged from said gas outlet;
   a holding unit disposed in said inner space, connected to said casing, and including a positioning frame that defines a ventilation opening;
   a gas-permeable plate being positioned between said holding unit and said inner flange and formed with a plurality of holes, the curtain-forming gas introduced into said inner space sequentially flowing through said ventilation opening of said positioning frame and said holes of said gas-permeable plate to be discharged from said gas outlet to form a gas curtain; and
   a plurality of fastener members, each having a head portion that is disposed in said inner space and that abuts against said positioning frame, and a stem portion that extends from said head portion and that extends through said positioning frame, said gas-permeable plate and into said inner flange of said casing so as to fasten said positioning frame and said gas-permeable plate to said inner flange such that said holding unit and said gas-permeable plate are positioned in said inner space.

2. The gas curtain device as claimed in claim 1, wherein said holding unit further includes a supporting member disposed between and abutting against said gas-permeable plate and said inner flange, said supporting member being formed with at least two ventilation holes each of which is in spatial communication with said gas outlet and a corresponding one of said holes of said gas-permeable plate, said fastener members detachably extending through said supporting member.

3. The gas curtain device as claimed in claim 2, wherein said supporting member includes a rectangular frame having two parallel long frame sections and two parallel short frame sections interconnecting said long frame sections, and at least one supporting wall having two ends connected respectively to intermediate portions of said long frame sections of said rectangular frame, said surrounding wall and said at least one supporting wall defining said at least two ventilation holes.

4. The gas curtain device as claimed in claim 3, wherein said supporting member includes a plurality of said supporting walls cooperating with said surrounding wall to define a plurality of said ventilation holes.

5. The gas curtain device as claimed in claim 2, wherein said supporting member includes a rectangular frame having two parallel long frame sections and two parallel short frame sections interconnecting said long frame sections, and at least one supporting wall having two ends connected respectively to intermediate portions of said short frame sections of said rectangular frame, said surrounding wall and said at least one supporting wall defining said at least two ventilation holes.

6. The gas curtain device as claimed in claim 5, wherein said supporting member includes a plurality of said supporting walls cooperating with said surrounding wall to define a plurality of said ventilation holes.

7. The gas curtain device as claimed in claim 2, wherein said supporting member has a supporting plate formed with a plurality of said ventilation holes each having a diameter ranging from 0.01 centimeters (cm) to 2 cm.

8. The gas curtain device as claimed in claim 2, wherein said supporting member has a thickness ranging from 2 millimeters (mm) to 5 mm.

9. The gas curtain device as claimed in claim 1, said positioning frame has a thickness ranging from 2 millimeters (mm) to 5 mm.

10. The gas curtain device as claimed in claim 1, wherein said casing further defines a casing opening, said casing opening and said gas outlet being disposed respectively at two opposite ends of said casing, said gas curtain box further including a cover removably covering said casing opening.

11. The gas curtain device as claimed in claim 10, further comprising a pipe unit adapted to be connected to an air purifying system supplying the curtain-forming gas, said gas curtain box further including a plurality of gas inlets respectively in spatial communication with said pipe unit and in spatial communication with said inner space such that the curtain-forming gas is introduced from said pipe unit into said gas inlets and said inner space of said casing.

12. The gas curtain device as claimed in claim 11, wherein said gas inlets are formed in at least one of said cover and said casing.

\* \* \* \* \*